United States Patent [19]

Uchikoshi

[11] Patent Number: 4,467,319
[45] Date of Patent: Aug. 21, 1984

[54] SIGNAL CONVERSION CIRCUIT

[75] Inventor: Gohji Uchikoshi, Higashimurayama, Japan

[73] Assignee: Nakamichi Corporation, Tokyo, Japan

[21] Appl. No.: 360,383

[22] Filed: Mar. 22, 1982

[30] Foreign Application Priority Data

Mar. 25, 1981 [JP] Japan .................................. 56-43410

[51] Int. Cl.³ ........................................... H03K 13/02
[52] U.S. Cl. .............................. 340/347 DA; 377/42; 377/107
[58] Field of Search .................. 340/347 DA, 347 M; 238/310; 377/107, 42, 108, 109, 110; 318/603

[56] References Cited

U.S. PATENT DOCUMENTS 3,648,275  3/1972  Bower ........................ 340/347 DA
4,139,840  2/1979  Mogi ........................... 340/347 DA
4,330,751  5/1982  Swain ................................. 377/107

Primary Examiner—C. D. Miller
Attorney, Agent, or Firm—Pearne, Gordon, Sessions, McCoy, Granger & Tilberry

[57] ABSTRACT

This invention relates to a signal conversion circuit, and more particularly to a signal conversion circuit to convert a digital signal sampled in synchronism with a sampling pulse into a pulse width signal having a pulse width corresponding to the digital value of the digital signal.

A first counter is preset to a first count value corresponding to the digital value of the sampled digital signal and begins to count a first clock signal having a predetermined pulse period from the first count value. A second counter is preset to a second count value which is a complement of the first count value and begins to count a second clock signal having a pulse period twice as many as that of the first clock signal from the second count value in response to the detection of a full count of the first counter. A rising edge of the pulse width signal responds to the detection of the full count of the first counter and a falling edge thereof responds to the detection of a full count of the second counter whereby the center of a pulse width of the pulse width signal has a predetermined phase relation to the sampling pulse.

7 Claims, 8 Drawing Figures

SIGNAL CONVERSION CIRCUIT

BACKGROUND OF THE INVENTION

In a conventional digital-to-analog conversion. there has been a method wherein after converting a digital signal sampled in synchronism with a sampling pulse into a pulse width signal having a pulse width corresponding to the digital value of the digital signal, the pulse width signal is decoded through a filter circuit into an analog signal. In such a prior art, in case that the digital signal is converted into the pulse width signal, as shown in FIG. 1, since the pulse widths $T_1, T_2, T_3$ --- of the pulse width signals $S_0$ are determined by time period from sampling times $t_1, t_2, t_3$ --- corresponding to the sampling pulse of the sampling signal $P_0$, the center of each pulse width of the pulse width signals $S_0$ tends to vary in accordance with the digital value of the sampled digital signal.

Accordingly, as shown in FIG. 2B, in the waveform $S'_A$ of the analog signal decoded by filtering the pulse width signal, the period T'a between the top and bottom of the waveform $S'_A$, during which the level of the analog signal decreases, is compressed relative to the corresponding period Ta of the waveform $S_A$ of the original analog signal as shown in FIG. 2A, while the period T'b between the bottom and top of the waveform $S'_A$, during which the level of the analog signal increases, is expanded relative to the corresponding period Tb of the original waveform $S_A$. Thus, it will be noted that the decoded analog signal is distorted. Such a distortion of the analog signal is negligible in case that the frequency of the sampling signal is fully higher than that of the analog signal, but it is disadvantageously considerable in case that the former frequency is a few times as many as the latter frequency.

SUMMARY OF THE INVENTION

Accordingly, it is a principal object of the invention to provide a signal conversion circuit adapted to produce a decoded signal having no distortion.

In accordance with the invention, there is provided a signal conversion circuit to convert a digital signal sampled in synchronism with a sampling pulse into a pulse width signal having a pulse width corresponding to the digital value of said digital signal and comprising;

a first counter to be preset to a first count value corresponding to a digital value of said digital signal and to begin to count a first clock signal having a predetermined pulse period from said first count value;

first detection means to detect a full count of said first counter;

a second counter to be preset to a second count value which is a complement of said first count value and to begin to count a second clock signal having a pulse period twice as many as that of said first clock signal from said second count value in response to the detection of the full count of said first counter by said first detection means;

second detection means to detect a full count of said second counter;

and a rising edge of said pulse width signal responding to the detection by said first detection means and a falling edge thereof responding to the detection by said second detection means whereby the center of a pulse width of said pulse width signal has a predetermined phase relation to said sampling pulse.

BRIEF DESCRIPTION OF THE DRAWINGS

The above and other objects and features of the invention will be apparent from the embodiment of the invention taken with reference to the accompanying drawings in which.

DETAILED DESCRIPTION OF THE EMBODIMENTS

Figure 1:
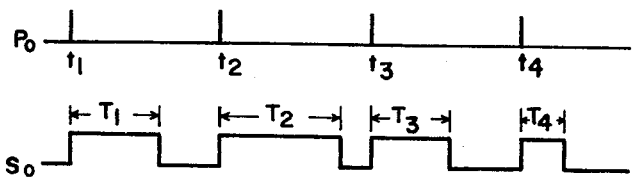
FIG. 1 illustrates the relation between a sampling signal and a pulse width signal in accordance with a prior art.
Figure 2A:
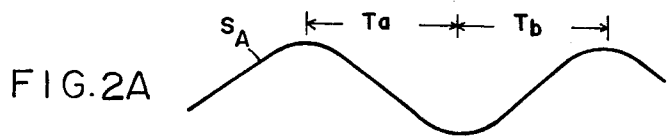
FIGS. 2A and 2B show waveforms of an original analog signal and a decoded analog signal in accordance with a prior art, respectively.
Figure 2B:
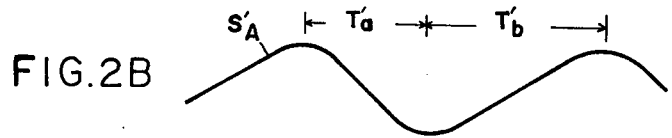
Figure 3:
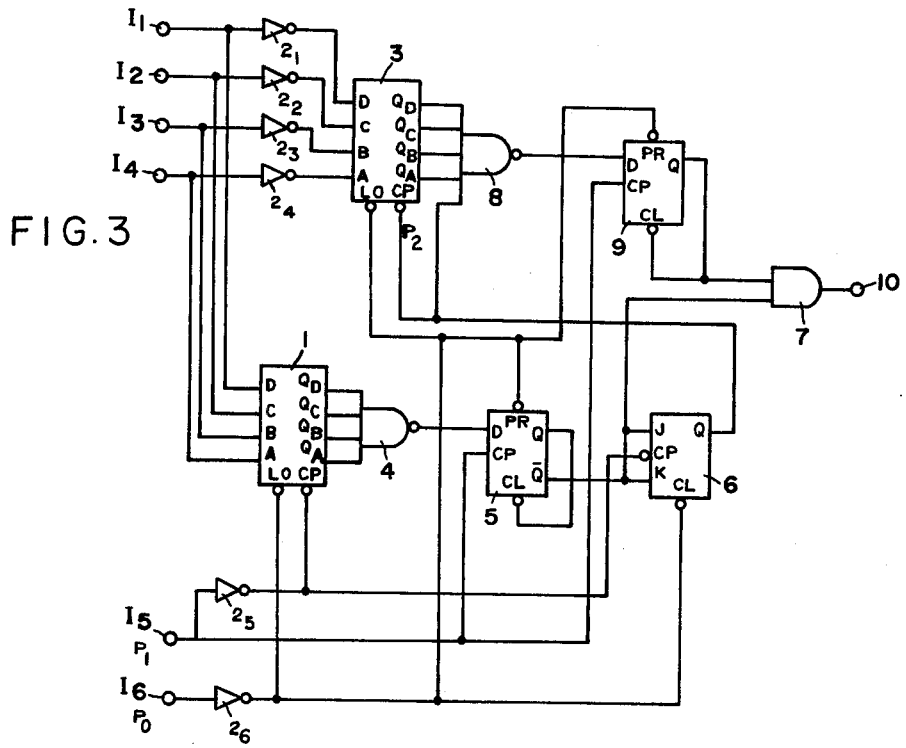
FIG. 3 is a schematic diagram of a signal conversion circuit constructed in accordance with one embodiment of the invention.
Figure 5:
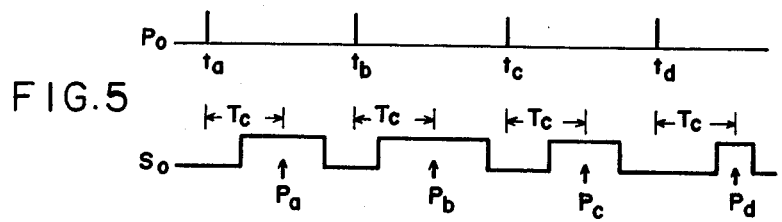
FIG. 5 illustrates the relation between a sampling signal and a pulse width signal in accordance with the invention.

Referring now to FIG. 3, there is shown a signal conversion circuit which deals with a 4-bits binary coded digital signal. The signal conversion circuit comprises a first counter 1 and a second counter 3 which are 4-bits binary counters having preset function, respectively. A digital signal sampled through input terminals $I_1$ through $I_4$ is applied directly to preset terminals A through D of the first counter 1. Also the digital signal is inverted by inverters $2_1$ through $2_4$ into an inverted digital signal having a digital value which is a complement of the digital values of the digital signal and applied to preset terminals A through D of the second counter 3. The first and second counters 1 and 3 operate to count up in response to falling edges of clock pulses applied to their clock terminals CP, respectively. A D-type flip-flop circuit 5 has a D-terminal connected to an output terminal of a NAND gate 4 to which binary outputs from output terminals $Q_A$ through $Q_D$ of the first counter 1 are applied. Both of a Q-terminal and a clear terminal CL of the D-type flip-flop circuit 5 are connected to each other so that an output from the Q-terminal is applied to the clear terminal CL. A Q-terminal of the D-type flip-flop circuit 5 is connected to J and K-terminals of a JK flip-flop circuit 6 and also to one of input terminals of an AND gate 7. A D-type flip-flop circuit 9 has a D-terminal connected to an output terminal of a NAND gate 8 to which binary outputs from output terminals $Q_A$ through $Q_D$ of the second counter 3 and an output from a Q-terminal of the JK flip-flop circuit 6 are applied. A Q-terminal of the D-type flip-flop circuit 9 is connected to a clear terminal CL thereof so that an output from the Q-terminal is applied to the clear terminal CL and is also connected to another input terminal of the AND gate 7. An output from the AND gate 7 is produced at an output terminal 10. A Q-terminal of the JK flip-flop circuit 6 is connected to a clock terminal CP of the second counter 3 so that an output from the Q-terminal of the JK flip-flop circuit 6 is applied to the clock terminal CP of the second counter 3.

An input terminal $I_5$ to which a clock signal $P_1$ is applied is connected directly to clock terminals CP of the D-type flip-flop circuits 5 and 9 and through an inverter $2_5$ to clock terminals CP of the first counter 1 and the JK flip-flop circuit 6. An input terminal $I_6$ to which a sampling signal $P_0$ is applied is connected through an inverter $2_6$ to load terminals LO of the first and second counters 1 and 3, to preset terminals PR of the D-type flip-flop circuits 5 and 9 and to a clear terminal CL of the JK flip-flop circuit 6.

In operation, as the sampling pulse $P_0$ is applied through the input terminal $I_6$ to the load terminals LO, to the preset terminals PR of the D-type flip-flop circuits 5 and 9 and to the clear terminal CL of the JK flip-flop circuit 6, the first counter 1 is preset to the first count value corresponding to the digital value of the digital signal sampled through the input terminals $I_1$ through $I_4$ while the second counter is preset to the second count value which is the complement of the first count value. At that time, the D-type flip-flop circuits 5 and 9 forcely become "High" (referred to as "Hi" hereinafter) at the Q-terminals while the JK flip-flop circuit 6 forcely becomes "Low" (refered to as "Lo" hereinafter) at the Q-terminal. Thereafter, since the clock signal $P_1$ is applied to the clock terminal CP of the first counter 1, it begins to count up from the preset first count value in response to the rising edge of the clock signal $P_1$, but the second counter 3 never counts because the output from the Q-terminal of the JK flip-flop circuit 6 which forms the clock signal $P_2$ to be applied to the clock terminal CP of the second counter 3 continues to be "Lo".

As the count value of the first counter 1 becomes a full count value so that the outputs from the output terminals $Q_A$ through $Q_D$ become "Hi", the NAND 4 changes the input at the D-terminal of the D-type flip-flop circuit 5 from "Hi" to "Lo" so that the output from the Q-terminal is changed from "Hi" to "Lo". This condition is positively kept until the subsequent sampling pulse is applied to the preset terminal PR of the D-type flip-flop circuit 5 because both of the Q-terminal and the clear terminal CL thereof are connected to each other. Since the output from the Q-terminal of the D-type flip-flop circuit 5 is changed from "Lo" to "Hi" in response to the output change of the Q-terminal thereof, the output from the AND gate 7 is changed from "Lo" to "Hi". And since the J and K-terminals of the JK flip-flop circuit 6 are changed from "Lo" to "Hi", the JK flip-flop circuit 6 begins to generate at the Q-terminal a clock signal $P_2$ having a pulse period twice as many as that of the first clock signal $P_1$ in synchronism with the rising edge of the clock signal $P_1$. This causes the second counter 3 to begin to count up from the preset second count value in response to the falling edge of the clock signal $P_2$.

As the count value of the second counter 3 becomes a full count value so that the output terminals $Q_A$ through $Q_D$ become "Hi", the NAND gate 8 changes its output in response to the subsequent rising edge of the clock signal $P_2$. Thus, the input at the D-terminal of the D-type flip-flop circuit 9 is changed from "Hi" to "Lo". The D-type flip-flop circuit 9 changes the output from the Q-terminal from "Hi" to "Lo" in synchronism with the rising edge of the clock signal $P_1$ applied to the clock terminal CP thereof. This condition is positively kept until the subsequent sampling pulse is applied to the preset terminal PR of the D-type flip-flop circuit 9 because both of the Q-terminal and the clear terminal CL thereof are connected to each other. The output from the AND gate 7 is changed from "Hi" to "Lo" in response to the output change of the Q-terminal of the D-type flip-flop circuit 9, whereby the pulse width signal so is produced at the output terminal 10.

Figure 4A:
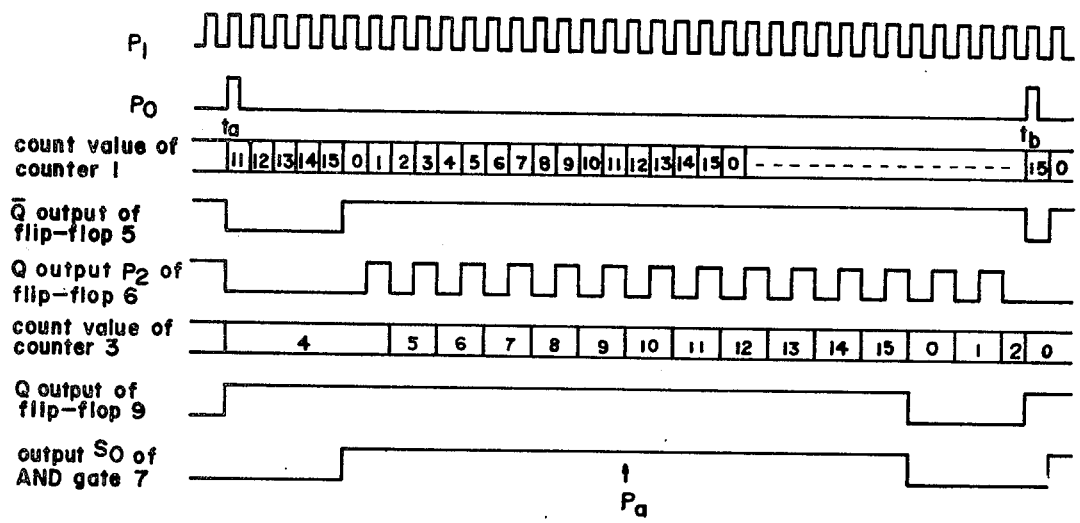
FIGS. 4A, 4B and 4C show time charts in which digital signals are converted into pulse width signals.
Figure 4B:
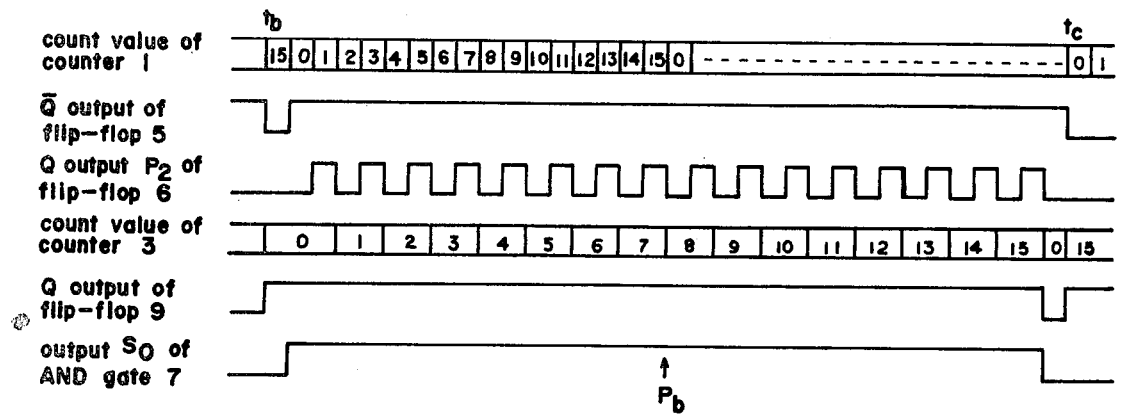
Figure 4C:
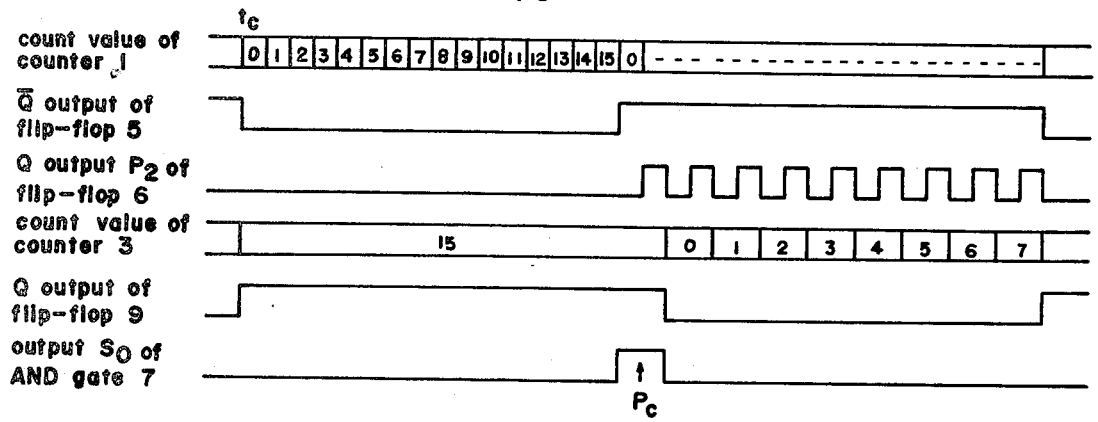

FIGS. 4A through 4C show time charts in case that the sampled digital signals having predetermined digital values are converted into the pulse width signals $S_O$. These figures show examples in which the decimal coded digital signals of 11, 15 and 0 are continuously converted into the pulse width signals $S_O$. The clock signal $P_1$ and the sampling signal $P_0$ are shown only in FIG. 4A and times $t_a$, $t_b$ and $t_c$ in FIGS. 4A through 4C indicate the sampling time responding to the rising edges of the sampling pulses. The count values of the counters 1 and 3 are indicated by the decimal coded numbers. In FIGS. 4A through 4C, the center of each pulse width of the pulse width signals $S_0$ is indicated by the numeral Pa, Pb or Pc.

As noted from FIGS. 4A through 4C and FIG. 5, the centers Pa, Pb and Pc of each pulse width of the pulse width signals $S_0$ are delayed for a given time Tc relative to the sampling times $t_a$, $t_b$, $t_c$ - - - in spite of the digital values of the sampled digital signals so that they have a given phase relation to the sampling times.

It will be noted that the signal conversion circuit of the invention may be applied to a digital-to-analog converter which converts a digital signal into a pulse width signal having a pulse width corresponding to the digital value of the digital signal and then converts it into an analog signal through a filter circuit. In this case, the conversion of the signals may be made without any distortion.

Although, in the illustrated embodiment, there is shown the circuit to convert the 4-bits digital signal into the pulse width signal, it will be understood that the number of bits of the digital signal is not limitted thereto, and that the 8-bits, 16-bits or more bits digital signal may be converted by the invention.

Furthermore, although, in the illustrated embodiment, there are used the up counters, it will be understood that there may be down counters. In this case, since the digital signal is converted into the pulse width signal having the pulse width inversely proportional to the digital value of the digital signal, it will be noted that the pulse width signal has to be treated with any required circuit when it is to be decoded into an analog signal, for example.

In another embodiment of the invention, a count value which is a complement of a digital value of a sampled digital signal may be preset at the first counter 1 while a count value which is the digital value of the digital signal may be preset at the second counter 3, which is reverse to the aforementioned embodiment. In the embodiment, the counters 1 and 3 may be preferably ones which are operated to count down because there can be produced such a pulse width signal as has a pulse width proportional to the digital value of the digital signal.

As in the embodiments, there may be preferably used the outputs from the output terminals of the counter for detecting the full count thereof because the detecting speed is higher, but there may be used an output from a carry terminal of a counter if provided.

What is claimed is:

1. A signal conversion circuit to convert a digital signal sampled in synchronism with a sampling pulse into a pulse width signal having a pulse width corresponding to the digital value of said digital signal and comprising;

a first counter to be preset to a first count value corresponding to a digital value of said digital signal and to begin to count a first clock signal having a predetermined pulse period from said first count value;

first detection means to detect a full count of said first counter;

a second counter to be preset to a second count value which is a complement of said first count value and to begin to count a second clock signal having a pulse period twice as many as that of said first clock signal from said second count value in response to the detection of said full count of said first counter by said first detection means;

second detection means to detect a full count of said second counter;

and a rising edge of said pulse width signal responding to the detection by said first detection means and a falling edge thereof responding to the detection by said second detection means whereby the center of a pulse width of said pulse width signal has a predetermined phase relation to said sampling pulse.

2. A signal conversion circuit as set forth in claim 1, wherein said first count value is said digital value while said second count value is a complement of said digital value.

3. A signal conversion circuit as set forth in claim 2, wherein said first and second counters are up counters.

4. A signal conversion circuit as set forth in claim 1, wherein said first count value is a complement of said digital value while said second count value is said digital value.

5. A signal conversion circuit as set forth in claim 4, wherein said first and second counters are down counters.

6. A signal conversion circuit as set forth in claim 1, wherein said first and second detection means comprise a NAND gate to receive the outputs from the corresponding counter and a D-type flip-flop circuit to receive the output from said NAND gate and to generate the output from a Q output terminal thereof.

7. A signal conversion circuit as set forth in claim 6, and further comprising a JK flip-flop circuit to receive the output from a Q output terminal of said D-type flip-flop circuit of said first detection means and to generate said second clock signal from an output terminal thereof.

* * * * *